(12) United States Patent
Matsumoto

(10) Patent No.: US 6,517,304 B1
(45) Date of Patent: Feb. 11, 2003

(54) METHOD FOR TRANSPORTING SUBSTRATES AND A SEMICONDUCTOR MANUFACTURING APPARATUS USING THE METHOD

(75) Inventor: Ken Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/536,754

(22) Filed: Mar. 28, 2000

(30) Foreign Application Priority Data

Mar. 31, 1999 (JP) .......................................... 11-091702

(51) Int. Cl.[7] .............................................. B65G 49/07
(52) U.S. Cl. ...................... 414/217; 414/411; 414/805; 414/811; 414/939
(58) Field of Search .............................. 414/217, 411, 414/416.03, 805, 811, 939, 940

(56) References Cited

U.S. PATENT DOCUMENTS

| | | | |
|---|---|---|---|
| 4,532,970 A | | 8/1985 | Tullis et al. .................. 141/98 |
| 4,534,389 A | | 8/1985 | Tullis .......................... 141/98 |
| 4,616,683 A | | 10/1986 | Tullis et al. .................. 141/98 |
| 5,772,386 A | | 6/1998 | Mages et al. ................ 414/411 |
| 5,895,191 A | * | 4/1999 | Bonora et al. ............... 414/217 |
| 6,071,059 A | | 6/2000 | Mages et al. ................ 414/411 |
| 6,106,213 A | * | 8/2000 | Denker ........................ 414/411 |
| 6,120,371 A | * | 9/2000 | Roberson, Jr. et al. ...... 454/187 |
| 6,142,722 A | * | 11/2000 | Genov et al. ................ 414/217 |
| 6,186,723 B1 | * | 2/2001 | Murata et al. ............... 414/217 |
| 6,273,664 B1 | * | 8/2001 | Doche ......................... 414/217 |
| 6,318,945 B1 | * | 11/2001 | Hofmeister .................. 414/217 |

FOREIGN PATENT DOCUMENTS

WO        WO 97/38440          * 10/1997

* cited by examiner

*Primary Examiner*—James W. Keenan
(74) *Attorney, Agent, or Firm*—Fitzpatrick, Cella, Harper & Scinto

(57) ABSTRACT

A method for transporting a substrate between a carrier, which holds the substrate, and a semiconductor manufacturing unit, which receives the substrate. The method includes steps of applying the carrier, which holds the substrate, to a chamber, which houses the semiconductor manufacturing unit, in which chamber the environment of the semiconductor manufacturing unit is controlled, rotatably removing, by an opener, a door of the carrier and a door of the chamber, as a unit, from the carrier and the chamber, and transferring the substrate from the carrier and to the carrier, when the door of the carrier and the door of the chamber have been rotatably removed as a unit by the opener in the removing step. Also disclosed are semiconductor manufacturing apparatus utilizing such a method.

18 Claims, 12 Drawing Sheets

PRIOR ART

PRIOR ART

METHOD FOR TRANSPORTING SUBSTRATES AND A SEMICONDUCTOR MANUFACTURING APPARATUS USING THE METHOD

BACKGROUND OF THE INVENTION

1. Field of the Invention

The present invention relates to a method for automatically transporting tabular substrates such as photomasks and reticles (hereinafter, generally referred to as reticles), or wafers and glass plates (hereinafter, generally referred to as wafers), and for transporting cassettes and carriers receiving the same. The present invention also relates to semiconductor manufacturing apparatuses using the method for processes such as exposure, rinsing, and inspection.

2. Description of the Related Art

Hitherto, reticle transporting devices and wafer transporting devices have been provided in semiconductor manufacturing apparatuses used in manufacturing processes of semiconductors, and in particular, in the semiconductor exposure apparatuses used in an exposure process. The transporting devices have been used in view of transporting efficiency and dust-proofing in order to improve the throughput and output rate.

The reticles used in the exposure process are typically transported in carriers, which receive the reticles one by one or in units of a plurality of reticles, from a reticle storage to each exposure apparatus, either manually or by an automatic transporting apparatus such as an AGV (automated guided vehicle) and OHT (over-head transfer) device, and are stored in storage shelves (hereinafter referred to as a library) provided in the exposure apparatus or in the vicinity thereof. The reticles thus stored are required to be delivered to an exposure stage in the exposure apparatus at a very high speed and with high accuracy. Particularly, due to the trend of limited productions of a wide range of products, the quantity of reticles to be stored in the library has recently increased according to the increasing varieties of devices to be manufactured.

Semiconductors are generally manufactured in clean rooms with a very high level of cleanliness class (low class number). In a process in which dust particles are strictly controlled, such as an exposure process, an exposure apparatus is installed in a clean chamber provided in a clean room, the clean chamber being maintained at a cleanliness of class 1 of particle sizes ranging from 0.1 $\mu$m to 0.2 $\mu$m.

Recently, a mini-environment philosophy known as an SMIF (Standardized Mechanical Interface) has been proposed which is disclosed, for example, in U.S. Pat. No. 4,532,970. This philosophy has been proposed in view of the fact that the processing rooms need only be partially clean and because the operating costs of downflow clean rooms, in which entire rooms are cleaned, are high due to the fact that a higher level of dust particle control is required for next-generation gigabit devices and a higher production efficiency is required in view of a recent slowdown in the semiconductor industry.

FIGS. 11A to 11D are side views of a known SMIF-type loading-port unit for reticles. An SMIF-type carrier unit 28, receiving a plurality of reticles 1, is set on a loading port 381, as shown in FIG. 11A. A lock of a carrier door 282 is released by a lock releasing mechanism included in a loading-port door 383 (in FIG. 11B). A reticle carrier library 283, receiving the plurality of reticles 1, is removed downwardly from a carrier 281, while the carrier door 282 and the loading-port door 383 are supported as a unit (in FIG. 11C). Thereafter, each of the reticles 1 is transferred by a transporting robot 42, as shown in FIG. 11D.

FIGS. 12A to 12D are side views of an FOUP (Front-Opening Unified Pod) type loading-port unit, which is standardized according to the SEMI standard for handling 12-inch wafers (12 inches=300 mm). When an FOUP-type carrier unit 29 is set on a loading port unit 391, as shown in FIG. 12A, the carrier unit 29 is positioned by kinematic coupling pins 392 and is applied to an outer wall of a chamber 6 by being pressed against the outer wall of the chamber 6 by an applying mechanism provided in the loading port unit 391, as shown in FIG. 12B. Then, the lock of a carrier door 292 is released by a lock releasing mechanism included in a chamber door 393, and the carrier door 292 and the chamber door 393 are removed by an opener 394 from a carrier 291 and the chamber 6 at the front side of the carrier 291, while the carrier door 292 and the chamber door 393 are held as a unit by a supporting mechanism included in the chamber door 393 (in FIG. 12C). The carrier door 292 and the chamber door 393 are moved downwardly as a unit (in FIG. 12D), thereby allowing transfer of the wafers 11 by a transporting robot 42.

When a plurality of the loading port units is required, the SMIF-type loading port units must be disposed in a horizontal direction, because a large space in the vertical direction is occupied due to the configuration thereof, in which the reticle carrier library is removed downwardly and the reticles are transferred. That is, a disadvantage of the SMIF system is that the footprint of the units is increased. In the same way, when a plurality of units is required, the FOUP-type loading port units must be disposed in a horizontal direction, because a large space in the vertical direction is occupied due to the configuration thereof, in which the carrier doors are removed downwardly, thereby increasing the footprint of the units, which is a disadvantage of the FOUP system.

Another problem is that dust particles adhering to the substrates while they are transported between carriers and semiconductor manufacturing apparatuses are not considered in these known apparatuses.

SUMMARY OF THE INVENTION

Accordingly, it is an object of the present invention to provide a method for transporting substrates and a semiconductor manufacturing apparatus using the method, in which a plurality of loading ports are provided with a footprint thereof being minimized and, while being transported, the surfaces of substrates are kept clean by an air-blower mechanism, from the viewpoint of a mini-environment to be applied to semiconductor manufacturing facilities.

To these ends, in accordance with a first aspect of the present invention, a method for transporting a substrate between a carrier, which holds the substrate, and a semiconductor manufacturing unit, which receives the substrate, is provided, which comprises the steps of applying the carrier to a chamber, which houses the semiconductor manufacturing unit, in which chamber the environment of the semiconductor manufacturing unit is controlled, rotatably removing, by an opener, a door of the carrier and a door of the chamber, as a unit, from the carrier and the chamber, and transferring the substrate from the carrier and to the carrier when the door of the carrier and the door of the chamber have been rotatably removed as a unit by the opener.

The method for transporting a substrate may further comprise the step of releasing a lock of the door of the carrier by a lock releasing mechanism provided in the door of the chamber.

The method may still further comprise the step of supporting the door of the carrier and the door of the chamber as a unit by a supporting mechanism provided in the door of the chamber.

In the method for transporting a substrate, the door of the carrier and the door of the chamber may be horizontally removed as a unit from the carrier and the chamber by the opener, and then rotated around a rotation axis by the opener.

The rotation axis around which the door of the carrier and the door of the chamber rotate as a unit, while being removed, may be disposed on a plane extending from the interface between the chamber and the door thereof, which is sealed.

The door of the carrier and the door of the chamber may be rotated downwardly around the rotation axis as a unit by the opener. The opener may be provided on an inner wall of the chamber.

In the method, a plurality of the openers and a plurality of loading ports for receiving the carriers may be provided in the chamber. The loading ports may be provided overlapping each other in the vertical direction.

In the method, a library may be provided in the vicinity of the semiconductor manufacturing unit for storing a plurality of the substrates.

The carrier in the method may receive one of the substrates, and the substrate may be a reticle.

According to a second aspect of the present invention, a semiconductor manufacturing apparatus is provided, which comprises a semiconductor manufacturing unit housed in a chamber in which the environment of the semiconductor manufacturing unit is controlled, an applying mechanism for applying a carrier, which holds a substrate, to the chamber, an opener for rotatably removing a door of the carrier and a door of the chamber, as a unit, from the carrier and the chamber, and a transporting mechanism for transferring the substrate from the carrier and to the carrier when the door of the carrier and the door of the chamber have been rotatably removed as a unit, and for transporting the substrate between the carrier and the semiconductor manufacturing unit.

The door of the chamber may be provided with a lock releasing mechanism for releasing a lock of the door of the carrier.

The door of the chamber may be provided with a supporting mechanism for supporting the door of the carrier and the door of the chamber as a unit.

The door of the carrier and the door of the chamber may be horizontally removed as a unit from the carrier and the chamber by the opener, and then rotated around a rotation axis by the opener.

The rotation axis around which the door of the carrier and the door of the chamber rotate as a unit, while being removed, may be disposed on a plane extending from the interface between the chamber and the door thereof, which is sealed.

The door of the carrier and the door of the chamber may be rotated downwardly around the rotation axis as a unit by the opener. The opener may be provided on an inner wall of the chamber.

The semiconductor manufacturing apparatus may further comprise a plurality of the openers and a plurality of loading ports for receiving the carriers.

The loading ports may be provided overlapping each other in the vertical direction.

The semiconductor manufacturing apparatus may further comprise a library for storing a plurality of the substrates in the vicinity of the semiconductor manufacturing unit.

The carrier may receive one of the substrates, and in the semiconductor manufacturing apparatus, the substrate may be a reticle.

According to a third aspect of the present invention, a method for transporting a substrate between a carrier and a semiconductor manufacturing unit is provided, the method comprising the steps of applying the carrier, which holds the substrate, to a chamber in which the environment of the semiconductor manufacturing unit is controlled, removing a door of the carrier and a door of the chamber, as a unit, from the carrier and the chamber by an opener provided on a transporting robot for transporting the substrate, and transferring the substrate from the carrier and to the carrier by the transporting robot when the door of the carrier and the door of the chamber have been removed as a unit by the opener.

The method for transporting a substrate may further comprise the step of releasing a lock of the door of the carrier by a lock releasing mechanism provided on the door of the chamber.

The method may still further comprise the step of supporting the door of the carrier and the door of the chamber as a unit by a supporting mechanism provided on the door of the chamber.

In the method, a plurality of the openers and a plurality of loading ports for receiving the carriers may be provided in the chamber. The plurality of the loading ports may be provided overlapping each other in the vertical direction. The plurality of the openers may be disposed such that a distance therebetween is the same as a distance between each of the loading ports.

In the method, a library for storing a plurality of the substrates may be provided in the vicinity of the semiconductor manufacturing unit.

The carrier may receive one of the substrates, and in the method for transporting a substrate, the substrate may be a reticle.

According to a fourth aspect of the present invention, a semiconductor manufacturing apparatus comprises a semiconductor manufacturing unit provided in a chamber in which the environment of the semiconductor manufacturing unit is controlled, an applying mechanism for applying a carrier, which holds a substrate, to the chamber, an opener for removing a door of the carrier and a door of the chamber, as a unit, from the carrier and the chamber, and a transporting robot for transferring the substrate from the carrier and to the carrier when the door of the carrier and the door of the chamber have been removed as a unit by the opener. The opener is provided in the manufacturing apparatus on a side of the transporting robot.

In the semiconductor manufacturing apparatus, the door of the chamber may be provided with a lock releasing mechanism for releasing a lock of the door of the carrier.

The door of the chamber may be provided with a supporting mechanism for supporting the door of the carrier and the door of the chamber as a unit.

The semiconductor manufacturing apparatus may further comprise a plurality of loading ports for receiving the carriers, and a plurality of the openers.

The loading ports may be provided overlapping each other in the vertical direction.

The openers may be disposed such that a distance therebetween is the same as a distance between each of the loading ports.

The semiconductor manufacturing apparatus may further comprise a library for storing a plurality of the substrates in the vicinity of the semiconductor manufacturing unit.

The carrier may receive one of the substrates, and in the semiconductor manufacturing apparatus, the substrate may be a reticle.

According to a fifth aspect of the present invention, a method for transporting a substrate between a carrier and a semiconductor manufacturing unit is provided, the method comprising the steps of applying the carrier, which holds the substrate, to a chamber, which houses the semiconductor manufacturing unit, in which chamber the environment of the semiconductor manufacturing unit is controlled, removing a door of the carrier and a door of the chamber, as a unit, from the carrier and the chamber by an opener, transferring the substrate from the carrier and to the carrier by a transporting robot for transporting the substrate when the door of the carrier and the door of the chamber have been removed as a unit by the opener, and applying air to the substrate by an air-blower mechanism provided on the transporting robot when the transporting robot supports, at least when transporting, the substrate by a handling mechanism provided on the transporting robot.

The air applied by the air-blower mechanism may be temperature-controlled.

The transporting robot may include a cover for covering the substrate held by the handling mechanism of the transporting robot.

In the method, the air-blower mechanism may apply air to the substrate while the substrate is being transferred from the carrier.

The carrier may receive one of the substrates, and in the method for transporting a substrate, the substrate may be a reticle.

According to a sixth aspect of the present invention, a semiconductor manufacturing apparatus comprises a semiconductor manufacturing unit provided in a chamber in which the environment of the semiconductor manufacturing unit is controlled, an applying mechanism for applying a carrier, which holds a substrate, to the chamber, an opener for removing a door of the carrier and a door of the chamber as a unit from the carrier and the chamber, a transporting robot for transferring the substrate from the carrier and to the carrier when the door of the carrier and the door of the chamber have been removed as a unit by the opener, and an air-blower mechanism provided on the transporting robot, for applying air to the substrate when the transporting robot supports, at least when transporting, the substrate by a handling mechanism provided on the transporting robot.

The air applied by the air-blower mechanism may be temperature-controlled.

The transporting robot may include a cover for covering the substrate held by the handling mechanism.

The air-blower mechanism may apply air to the substrate while being transferred from the carrier.

The carrier may receive one of the substrates, and in the semiconductor manufacturing apparatus, the substrate may be a reticle.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

<First Embodiment>

Figure 1B:
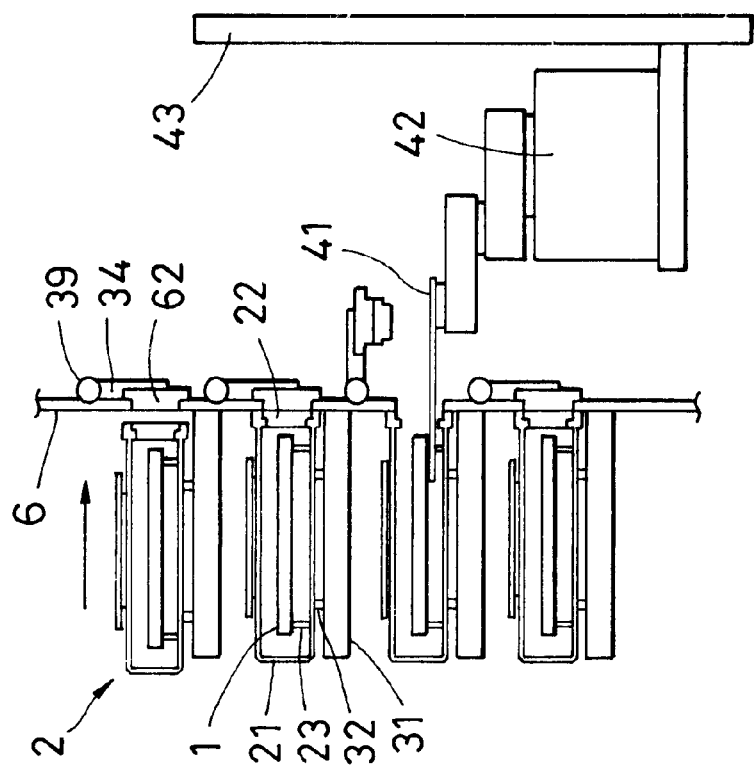
FIG. 1A and FIG. 1B are side views showing an operation of a loading port unit according to a first embodiment of the present invention.
Figure 1A:
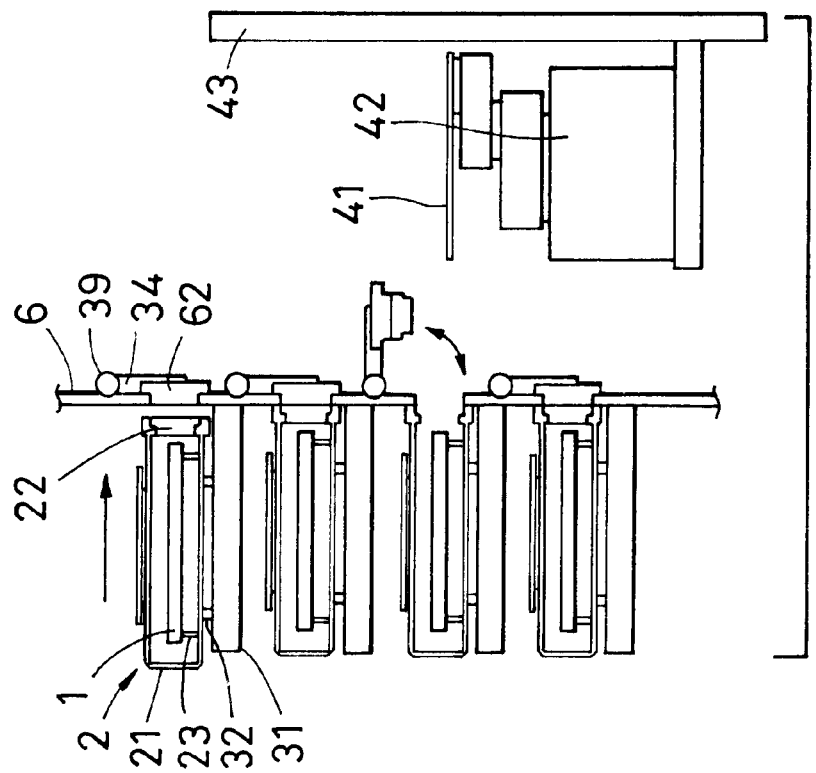

FIGS. 1A and 1B show a first embodiment of the present invention. FIGS. 1A and 1B are side views showing an operation of a loading port unit included in a semiconductor exposure apparatus shown in FIG. 10.

An outline of the flow of reticles in the semiconductor exposure apparatus is described as follows in conjunction with FIG. 10. The environment in the semiconductor exposure apparatus is separated from the environment of a clean room by forming a chamber 6 in the clean room, and the condition of the air in the chamber 6 is controlled. Reticles 1 are held in carrier units 2, which are set in a plurality of loading ports 31 disposed vertically. The reticles 1 are transferred from the carrier units 2 by a reticle transporting mechanism 4 for loading and unloading reticles. Codes on the reticles are read by an identification reading unit 51 for registering and confirming reticle identifications. The reticles 1 are positioned to be aligned with a reticle stage 71 by an alignment station 54, and then transferred onto the reticle stage 71 for exposure.

Figure 10:
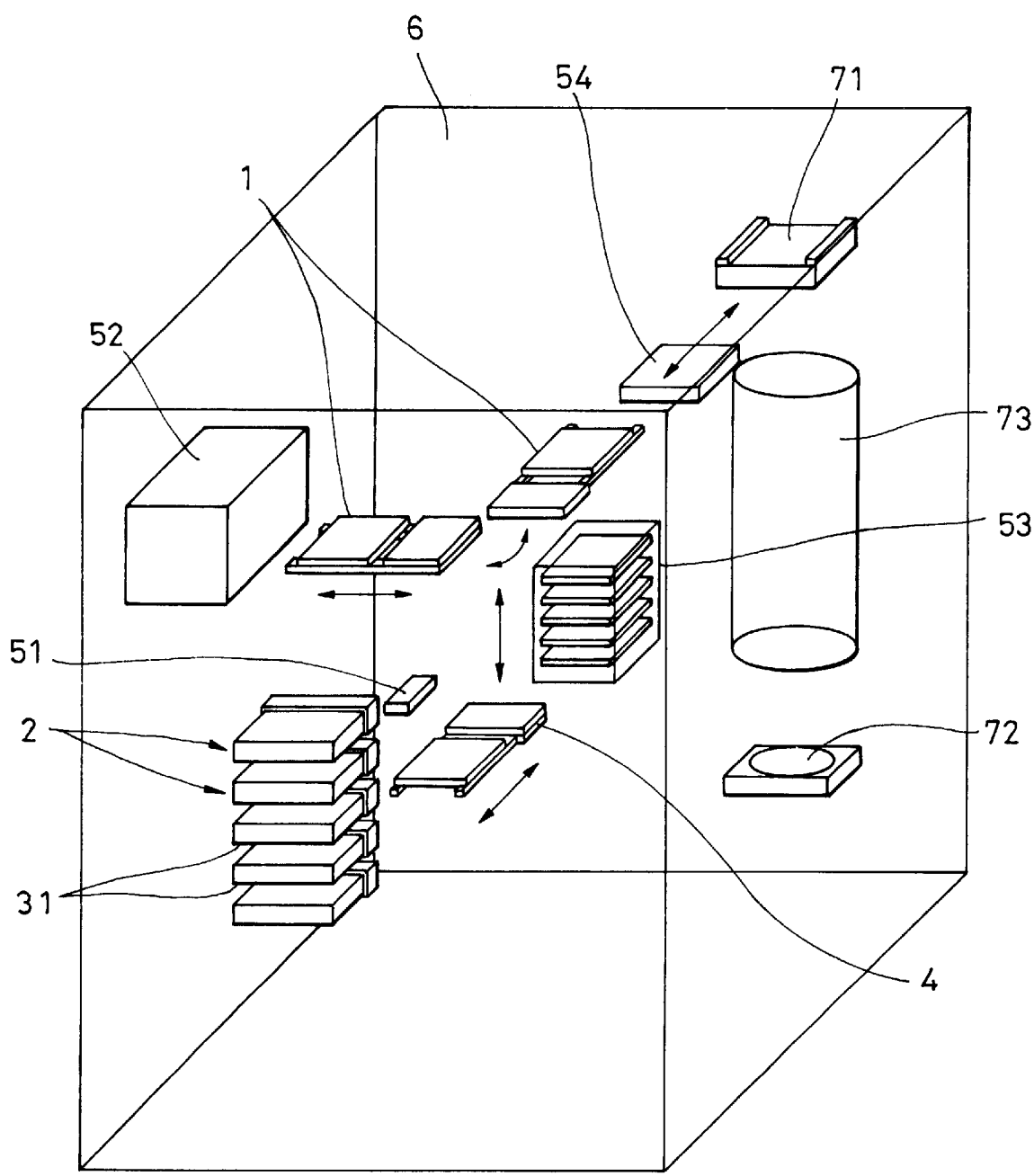
FIG. 10 is an illustration of a semiconductor exposure apparatus.
Figure 11A:
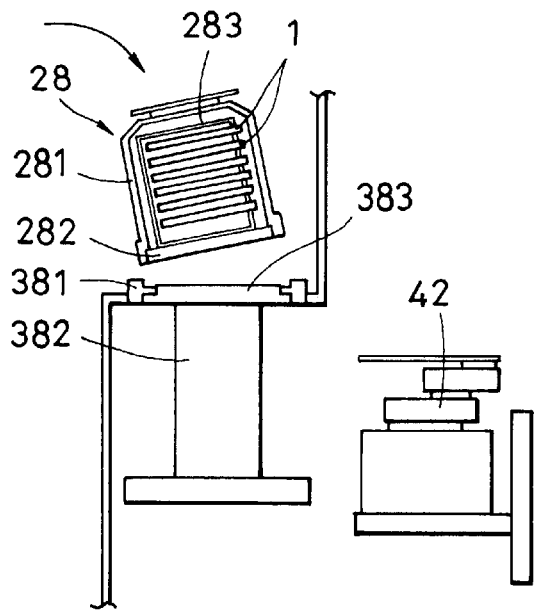
FIG. 11A, FIG. 11B, FIG. 11C, and FIG. 11D are side views showing an operation of an SMIF-type loading port unit for reticles.
Figure 11B:
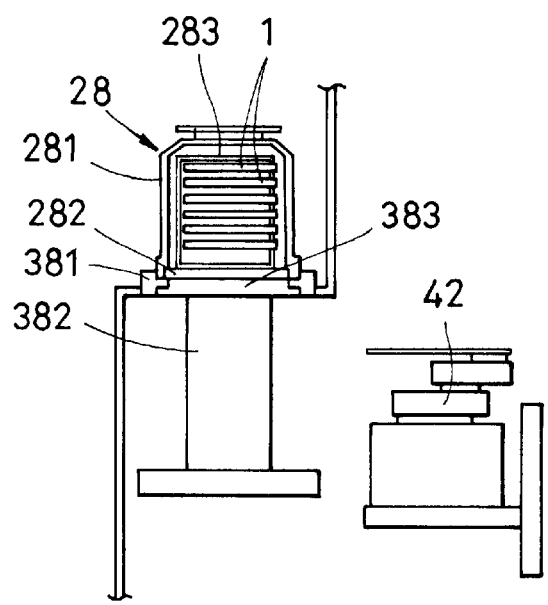
Figure 11C:
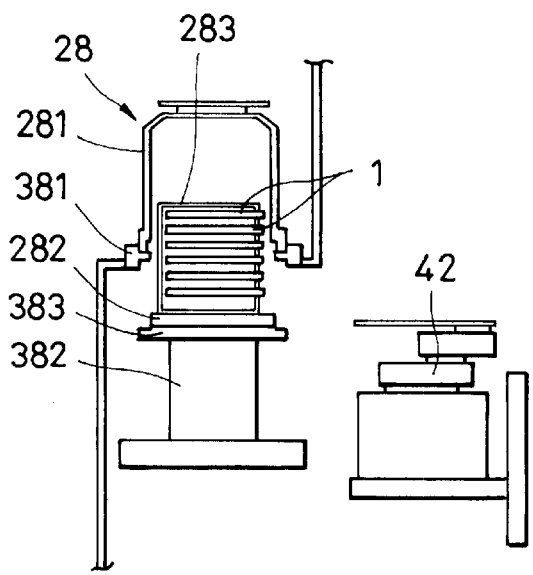
Figure 11D:
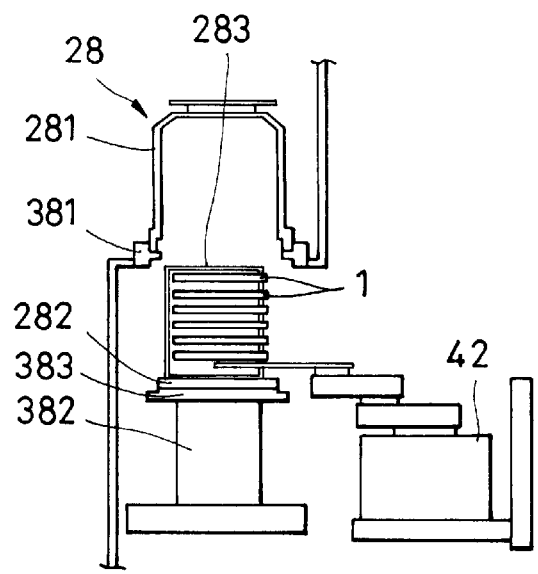
Figure 12A:
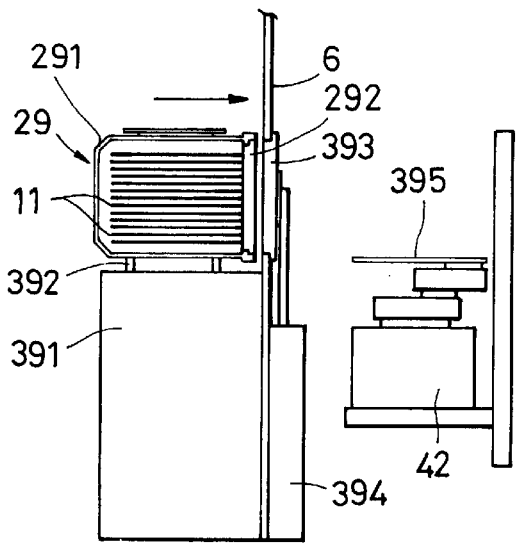
FIG. 12A, FIG. 12B, FIG. 12C, and FIG. 12D are side views showing an operation of an FOUP-type loading port unit for wafers.
Figure 12B:
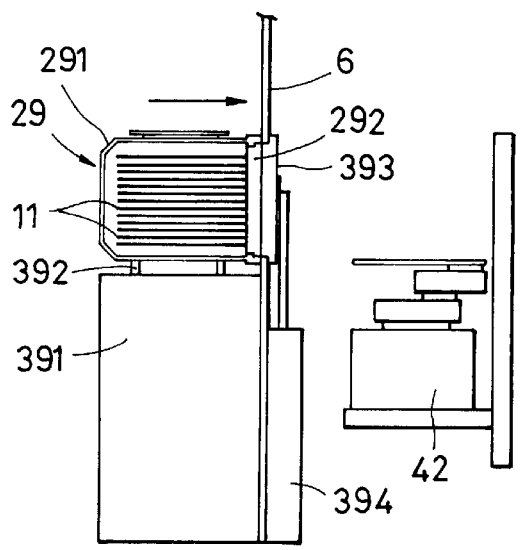
Figure 12C:
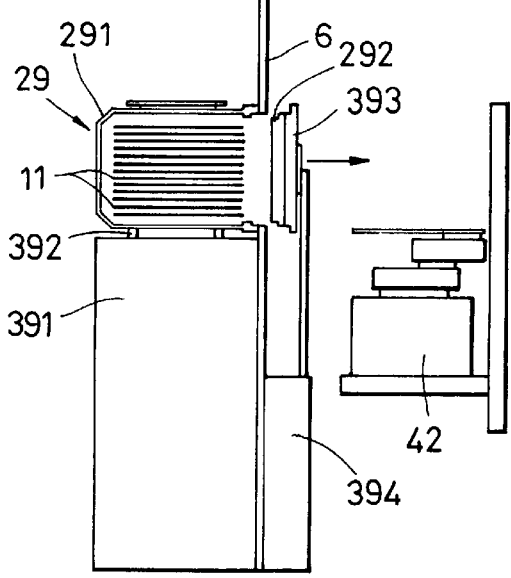
Figure 12D:
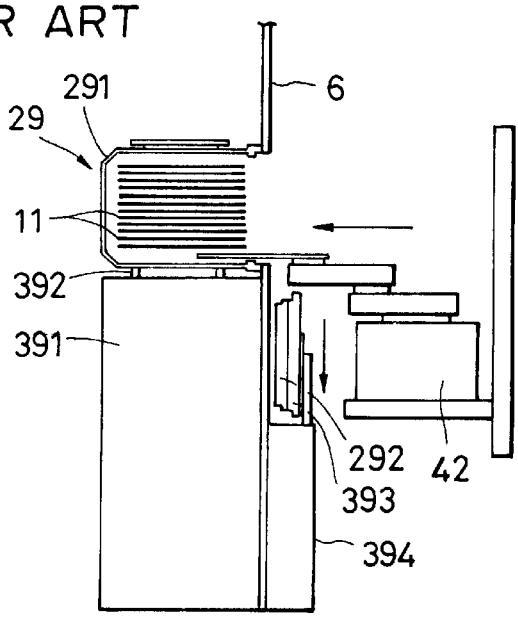

The semiconductor exposure apparatus shown in FIG. 10 includes an optical projection lens 73, a wafer stage 72, and an inspection unit 52 for inspecting surfaces of the reticles 1 to detect dust particles thereon. The semiconductor exposure apparatus also includes a library 53 for storing a plurality of the reticles 1, provided adjacent to the reticle stage 71. When the schedule of reticles to be used is known, the reticles 1 can be transported in advance, after the dust particle inspection, to be stored in the library 53, whereby the time for reticle exchange can be reduced, thereby enabling efficient reticle management.

With reference to FIGS. 1A and 1B and FIGS. 2A and 2B, the loading port unit is described in detail as follows. Each reticle 1 is supported in the carrier unit 2 by a reticle supporting member 23, the aperture of the carrier unit 2 being hermetically sealed by a carrier door 22. The carrier unit 2 is transported manually or by an automatic transporting mechanism such as an AGV to be set on a loading port 31.

Figure 2A:
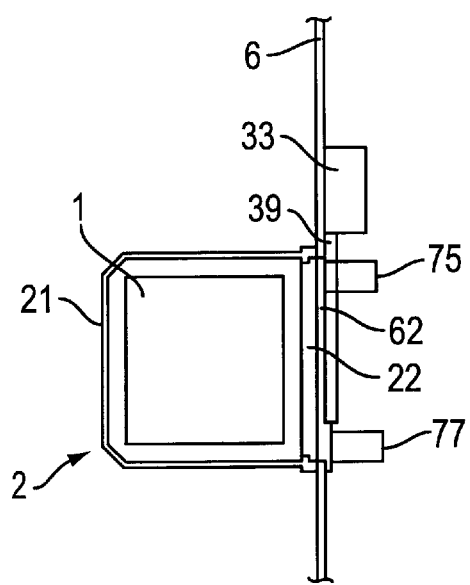
FIG. 2A and FIG. 2B are top views showing the operation of the loading port unit according to the first embodiment of the invention.

The position of the transported carrier unit 2 on the loading port 31 is corrected by kinematic coupling pins 32, which are standardized according to the SEMI standard, the carrier unit 2 being brought into contact with the kinematic coupling pins 32 by a clamping mechanism. Each carrier unit 2 is applied by an applying mechanism provided in the loading port 31 to the chamber 6 by translationally moving the kinematic coupling pins 32 and the clamping mechanism to be pushed against an outer wall of the chamber 6. In this case, a carrier 21 of the carrier unit 2 and the chamber 6 are hermetically connected by a sealing member such as an O-ring provided on the outer wall of the chamber 6, as shown in FIG. 2A.

The aperture of the chamber 6 is sealed by a chamber door 62, unless the carrier unit 2 is applied to the chamber 6. The chamber door 62 includes a lock releasing mechanism 75 for releasing a lock of the carrier door 22 and a supporting mechanism 77, such as a vacuum chuck for supporting the chamber door 62 together with the carrier door 22. When the carrier unit 2 is applied to the chamber 6, the lock of the carrier door 22 is released by the lock releasing mechanism, and the carrier door 22 and the chamber door 62 are supported as a unit by the supporting mechanism. The carrier door 22 and the chamber door 62 are supported so that dust particles of the external environment adhering to the outer sides of the two doors are trapped therebetween.

Figure 2B:
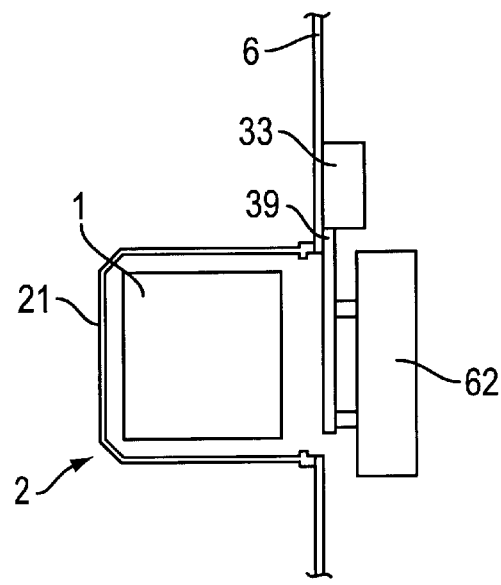
Figure 3B:
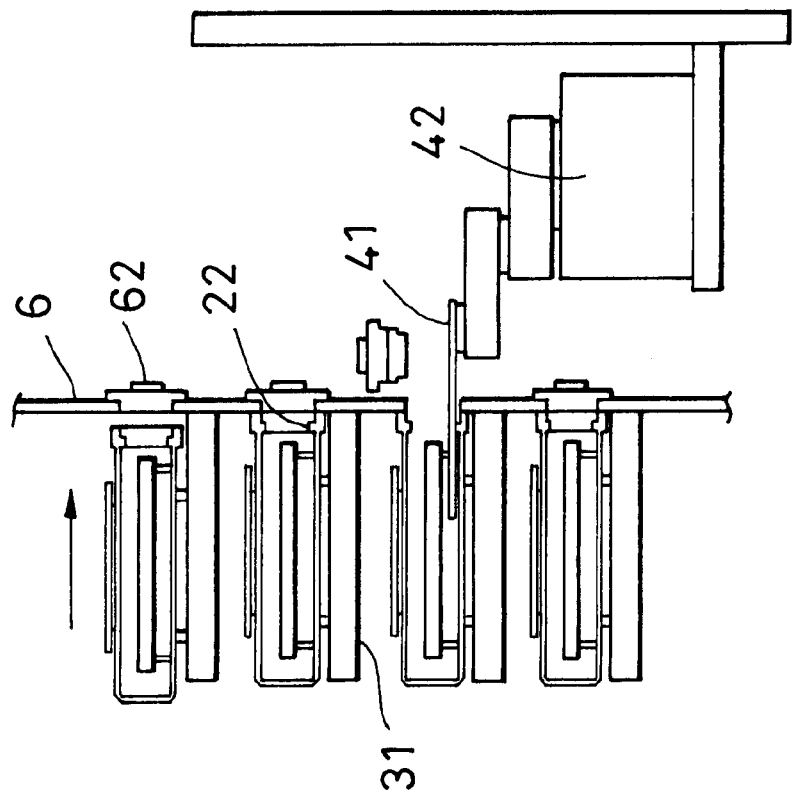
FIG. 3A and FIG. 3B are side views showing an operation of the loading port unit according to the first embodiment of the invention, further including a horizontal removing movement.
Figure 3A:
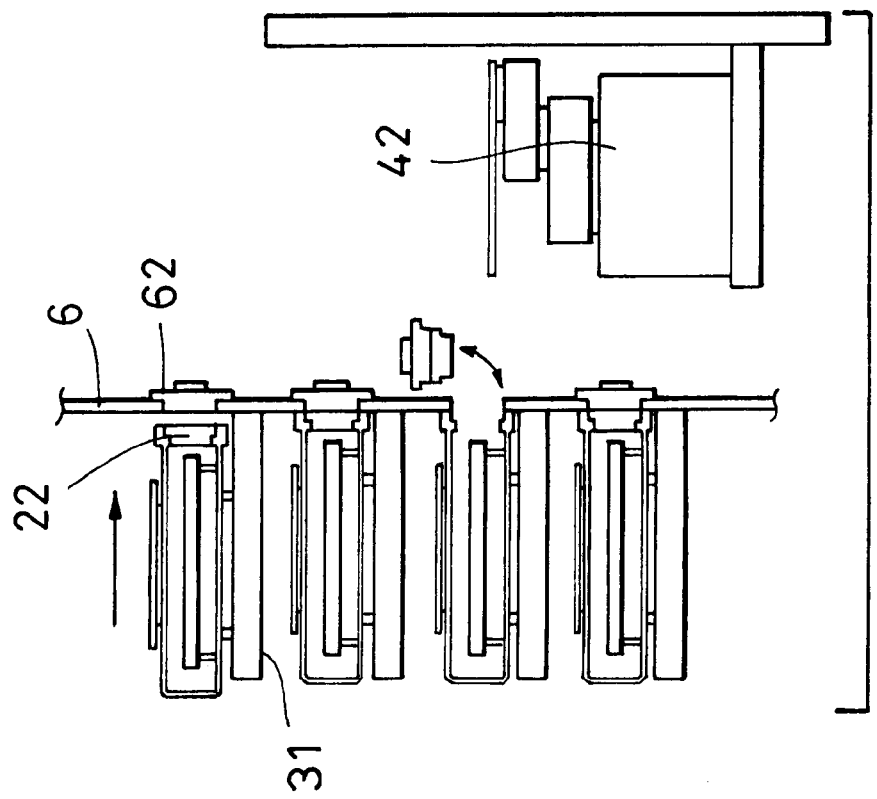

Each carrier door 22 and each chamber door 62, which are supported as a unit, are removed, while rotating, from the carrier 21 and the chamber 6 by an opening arm 34 supported by an opener 33, as shown in FIGS. 1A and 2B. Each reticle 1 in the carrier 21 is loaded and unloaded by a transfer handler 41, as shown in FIG. 1B. Rotating axes 39, around which the doors rotate, are disposed on a plane extending from the interface, which is the sealed plane, between the chamber 6 and the chamber doors 62, thereby enabling the carrier doors 22 and the chamber doors 62 to rotate while being removed smoothly with no sliding movement.

A transporting robot 42 is driven in the extending/drawing-back direction of a handling arm thereof and in the rotational direction of the transporting robot 42. An elevator 43 is a mechanism for lifting the transporting robot 42. The openers 33 and the opening arms 34 are provided at each loading port 31 so that each carrier unit 2 can independently be opened and closed. Therefore, each of the reticles 1 can be transferred, to be loaded, from the carrier unit 2 immediately after another reticle 1 is unloaded and transferred to another carrier unit 2 by opening the carrier units 2 in advance, whereby the time for transfer can be reduced.

Figure 4C:
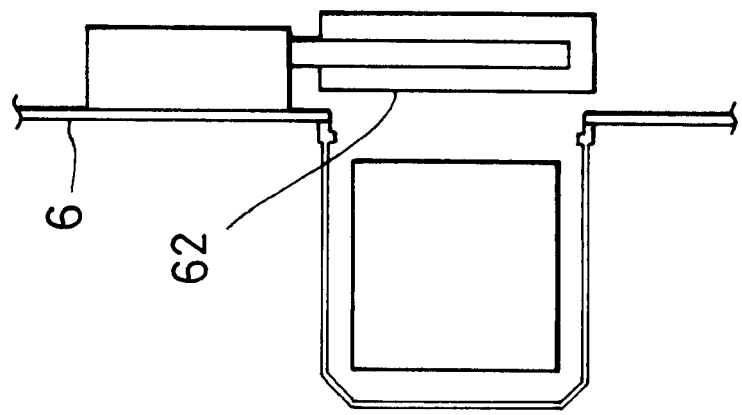
FIG. 4A, FIG. 4B, and FIG. 4C are top views showing the operation of the loading port unit according to the first embodiment of the invention, including the horizontal removing movement.
Figure 4B:
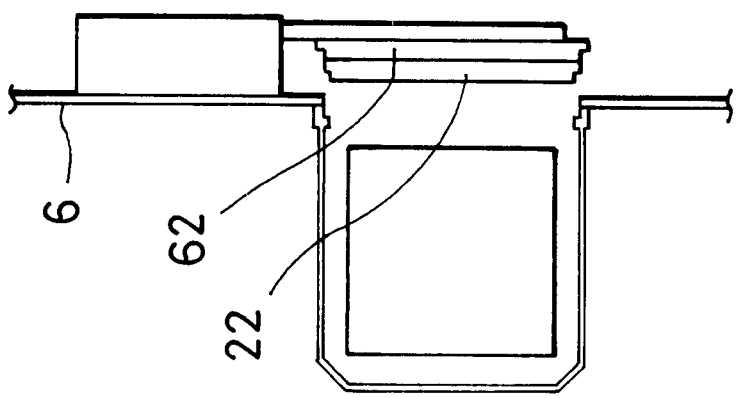
Figure 4A:
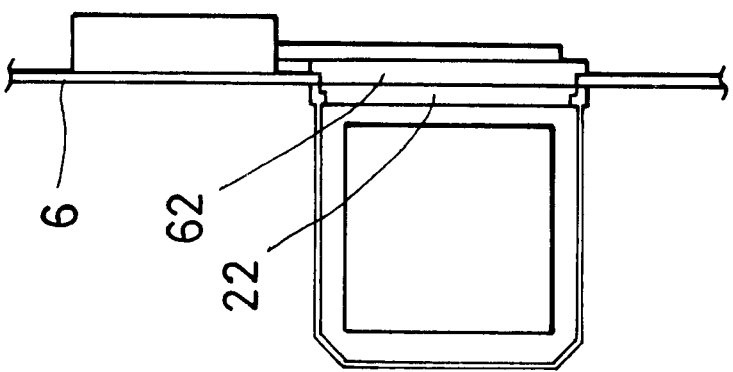

In FIGS. 3A and 3B and FIGS. 4A, 4B, and 4C, the carrier door 22 and the chamber door 62 may be removed from the carrier 21 and the chamber 6 in the horizontal direction (in FIG. 4B), and then rotated around a horizontal axis (in FIG. 4C). With this arrangement, the space required for rotating the doors can be reduced, whereby the distance between the loading ports 31 and the transporting robot 42 can be reduced, thereby providing an advantage in that the footprint of the devices and the movement stroke of the transporting robot 42 can be reduced.

The carrier doors 22 and the chamber doors 62 may be rotated to be removed downwardly from the carriers 21 and the chamber 6 when there is a risk of not sufficiently trapping dust particles from the outside of the chamber 6 between the carrier doors 22 and the chamber doors 62, instead of being rotated to be removed upwardly, according to this embodiment.

<Second Embodiment>

Figure 5A:
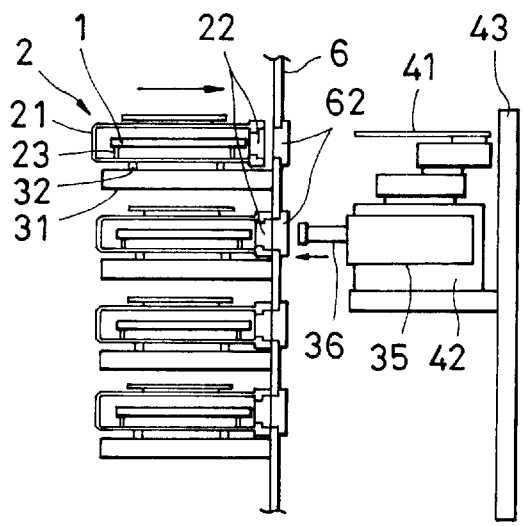
FIG. 5A, FIG. 5B, and FIG. 5C are side views showing an operation of the loading port unit according to a second embodiment of the present invention.
Figure 5B:
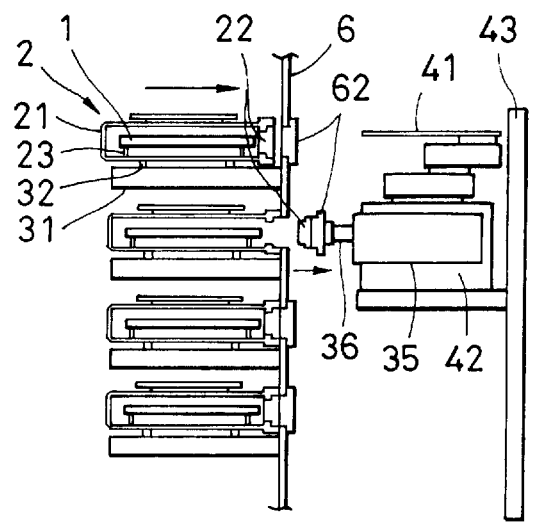
Figure 5C:
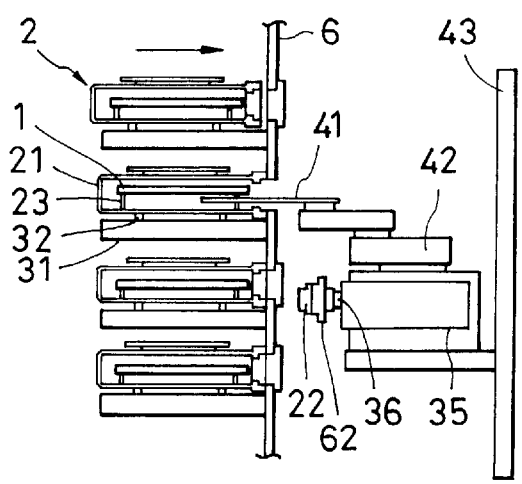

FIGS. 5A, 5B, and 5C, showing a second embodiment according to the present invention, are side views showing an operation of the loading port unit included in the semiconductor exposure apparatus shown in FIG. 10.

Each of reticles 1 is supported by a reticle supporting member 23 in a carrier unit 2. The aperture of each carrier 21 is hermetically sealed by a carrier door 22. The carrier units 2 are transported either manually or by a transporting mechanism such as an AGV to be set onto loading ports 31.

The position of each of the transported carrier units 2 on the loading ports 31 is corrected by kinematic coupling pins 32, which are standardized according to the SEMI standard, the carrier unit 2 being brought into contact with the kinematic coupling pins 32 by a clamping mechanism. Each carrier unit 2 is applied by an applying mechanism provided in the loading port 31 to the chamber 6 by translationally moving the kinematic coupling pins 32 and the clamping mechanism to be pushed against an outer wall of the chamber 6. In this case, the carrier 21 of the carrier unit 2 and the chamber 6 are hermetically connected by a sealing member such as an O-ring provided on the outer wall of the chamber 6.

The apertures of the chamber 6 are sealed by chamber doors 62, unless the carrier units 2 are applied to the chamber 6. Each chamber door 62 includes therein a lock releasing mechanism for releasing a lock of the carrier door 22 and a supporting mechanism such as a vacuum chuck for supporting the chamber door 62 and the carrier door 22 as a unit. When the carrier units 2 are applied to the chamber 6, the lock of each carrier door 22 is released by the carrier lock releasing mechanism, and the carrier door 22 and the chamber door 62 are supported as a unit by the supporting mechanism. The carrier door 22 and the chamber door 62 are supported so that any dust particles from the external environment adhering on the outer sides of the two doors are trapped therebetween.

An opener 35 and an opening arm 36 are provided at a transporting robot 42 side. The opener 35 and the opening arm 36 are vertically driven together with the transporting robot 42. When the carrier units 2 are applied to the chamber 6, the transporting robot 42 is lifted by an elevator 43 to the level of a door to be opened or closed, the opener 35 extends the opening arm 36 (in FIG. 5A), and the opening arm 36 docks with the chamber door 62.

The carrier door 22 and the chamber door 62, while being supported as a unit, are removed from the carrier 21 and the chamber 6 by the opening arm 36 supported by the opener 35, as shown in FIG. 5B, and are drawn toward the transporting robot 42 to be held thereby. Then, the transporting robot 42 is moved by the elevator 43 to the level at which the reticle 1 is transferred, and the reticle 1 is transferred from or to the carrier 22 by a transfer handler 41, as shown in FIG. 5C.

Figure 6:
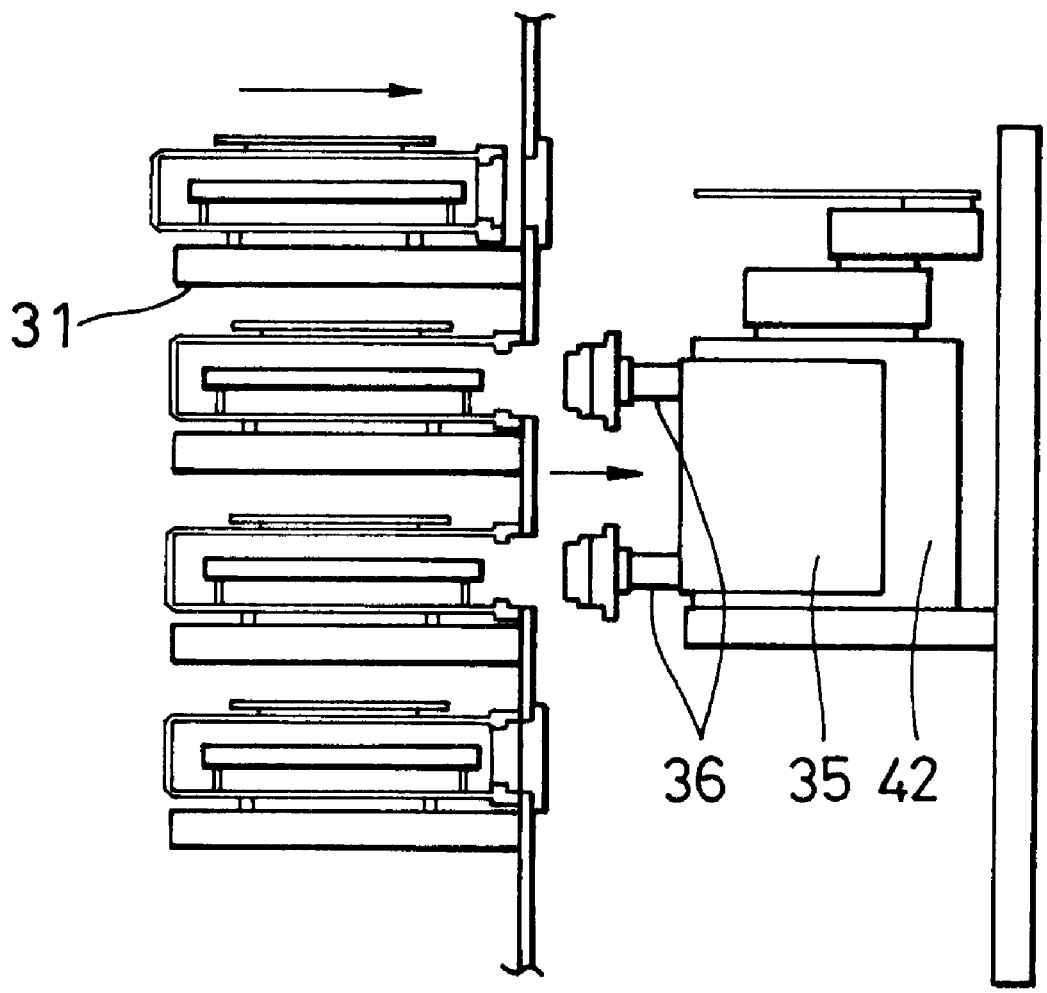
FIG. 6 is a side view of the loading port unit according to the second embodiment of the invention, in which two openers are provided such that a distance therebetween is the same as a distance between each loading port.

A plurality of the openers 35 and a plurality of the opening arms 36 may be provided at the transporting robot 42 side, whereby a plurality of the carriers 22 can be kept open simultaneously. With this arrangement, each reticle 1 can be transferred, to be loaded, from the carrier unit 2 immediately after another reticle 1 is unloaded and transferred to another carrier unit 2, thereby reducing transfer time. A plurality of the opening arms 36 may be provided with the same distance therebetween as that between each loading port 31 so that a plurality of the carrier doors 22 and the chamber doors 62 can be opened or closed simultaneously, as shown in FIG. 6.

In the same manner as in the first embodiment, when the schedule of reticles to be used is known, the reticles 1 may be transported in advance to be stored in the library 53, whereby the time for reticle exchange can be reduced, thereby enabling efficient reticle management.

Figure 7A:
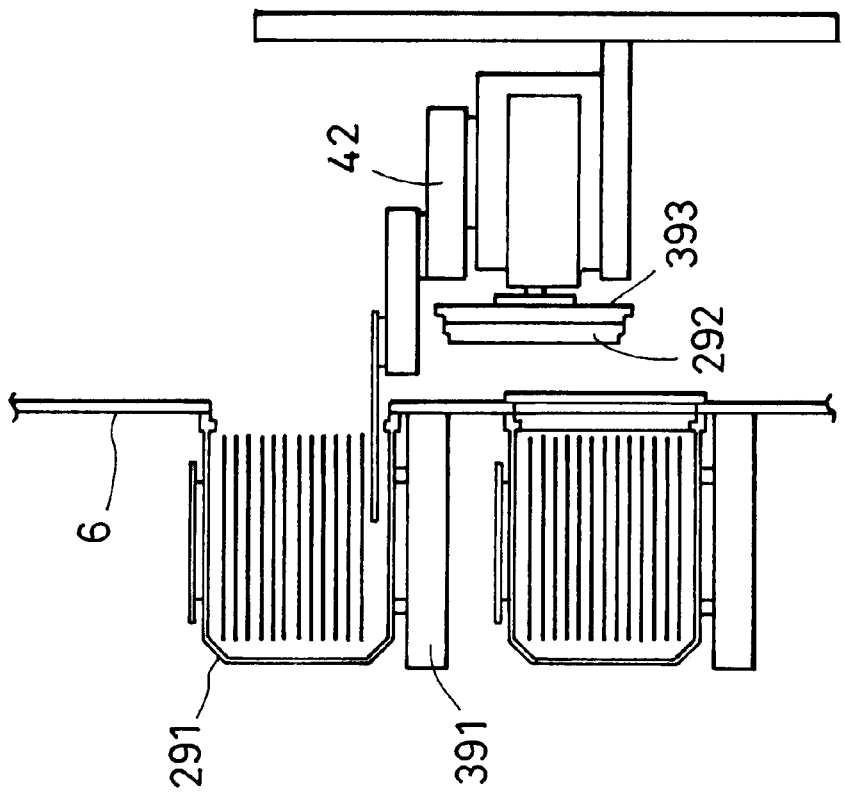
FIG. 7A and FIG. 7B are side views showing an operation of the loading port unit according to the second embodiment of the invention, in which an FOUP system for wafers is applied.
Figure 7B:
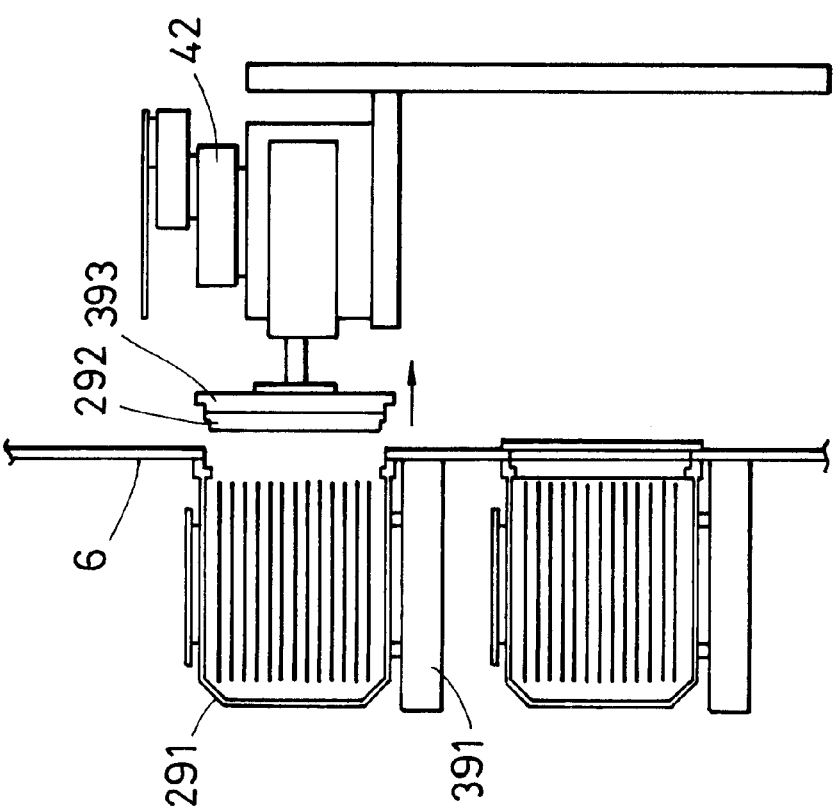

In FIGS. 7A and 7B, the loading port unit according to the second embodiment is applied to the FOUP system. The above-described FOUP-type carrier door 292 and the chamber door 393, standardized according to the SEMI standard, while being supported as a unit, are removed from the carrier 291 and the chamber 6, and then vertically moved together with the transporting robot 42, while being supported at the transporting robot 42 side, for the transfer of substrates. With this arrangement, the loading ports 391 can be disposed to overlap each other, as shown in FIGS. 7A and 7B, because openers provided in known loading port units for downwardly moving doors are eliminated, thereby reducing the footprint of the apparatuses.

In the loading port unit according to the invention, the space occupied by the apparatuses can be reduced when a plurality of the loading ports must be horizontally disposed due to limited space in a vertical direction, because the height of the loading ports can be reduced.

<Third Embodiment>

Figure 8A:
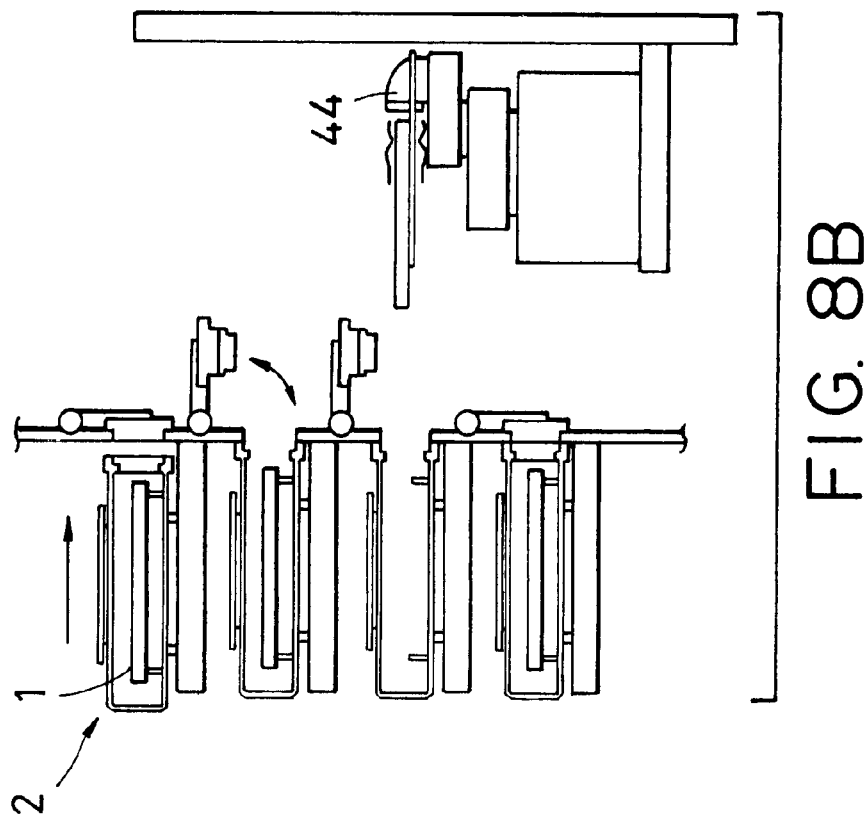
FIG. 8A and FIG. 8B are side views showing an operation of the loading port unit according to a third embodiment of the present invention.
Figure 8B:
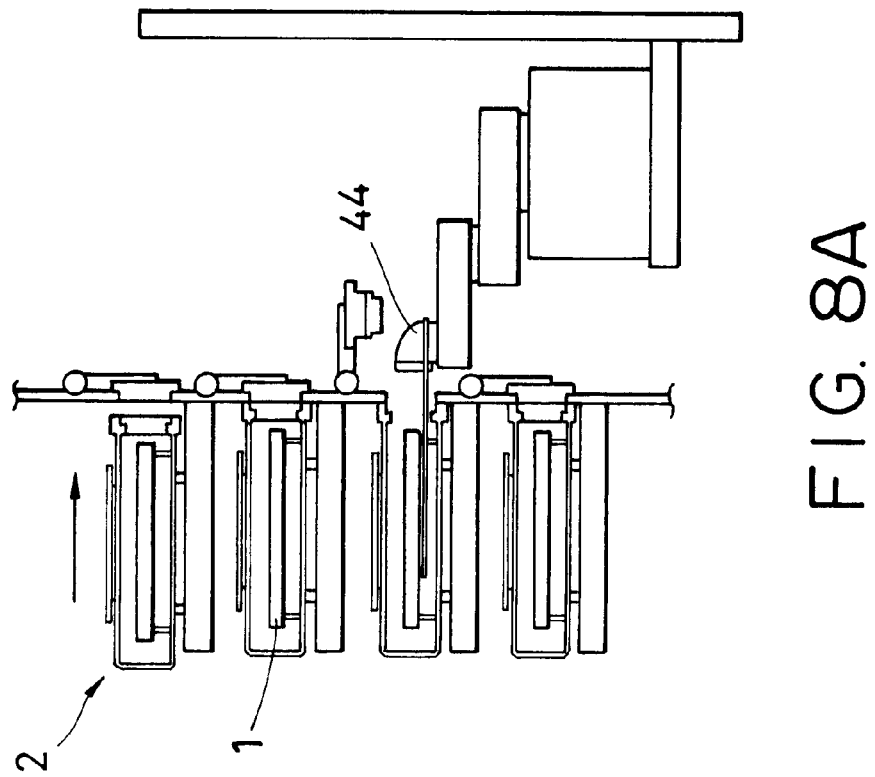

FIGS. 8A and 8B, showing a third embodiment according to the present invention, are side views showing an operation of the loading port unit included in the semiconductor exposure apparatus shown in FIG. 10. For the third embodiment, a description of the same parts as those described in the first embodiment is omitted.

Figure 9:
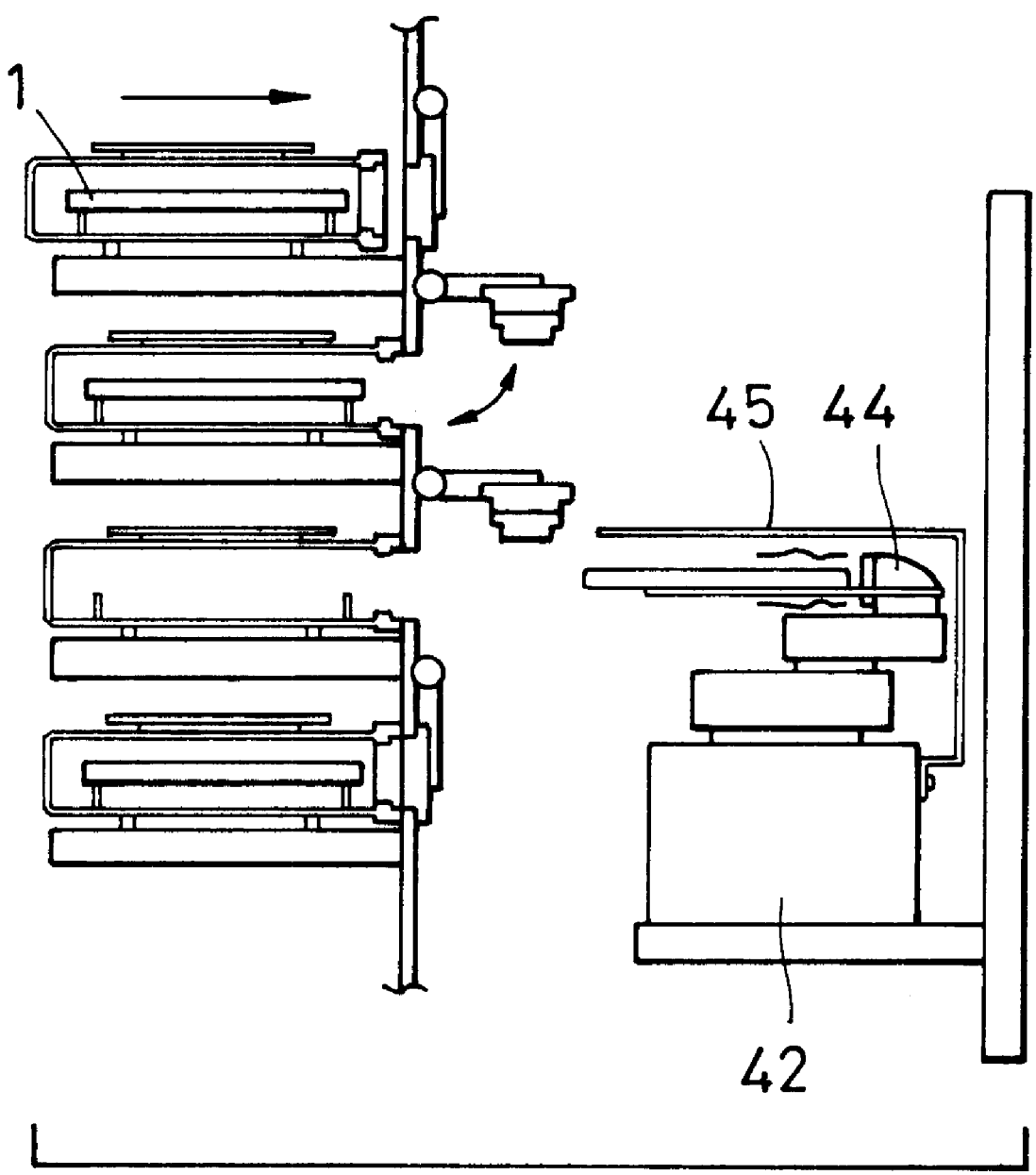
FIG. 9 is a side view of the loading port unit according to the third embodiment of the invention, further including a cover.

The loading port unit includes an air-blower mechanism 44 for applying clean air or temperature-controlled clean air to the reticles 1 during transferring. The clean air starts to be applied to the reticles 1 when they are removed or after being removed from the carrier units 2, and is continuously applied to the reticles 1 while the reticles being removed from the carrier units 2 or while being transferred, as shown in FIG. 8B, whereby the surfaces of the reticles 1 can be kept clean, thereby enabling very reliable dust-particle control. As shown in FIG. 9, the transporting robot 42 may be provided with a cover 45 for covering the reticle 1, whereby indeterminate factors such as effects of dust particles produced by the moving parts in the chamber can be avoided, thereby enabling a more reliable dust-particle control.

According to the first embodiment of the present invention, a plurality of the loading ports can be provided in the vertical direction, and the carrier doors and the chamber doors can be rotatably removed as a unit by the opener, whereby an efficient substrate-transporting system is provided without increasing the footprint of the loading port units.

According to the second embodiment of the present invention, a low cost apparatus can be obtained by eliminating the openers provided on the loading ports. The embodiment is most preferably applied to a loading port unit having less than five carrier units, because the number of carriers which can be kept open simultaneously is limited.

On the other hand, the same efficient transportation as in the loading port unit having less than five carrier units can be provided in the loading port unit according to the first embodiment, when having more than five carrier units, because the carriers can independently be opened and closed by providing openers on all the loading ports, according to the first embodiment.

According to the third embodiment of the present invention, the substrates can be kept clean while being transported, thereby providing a substrate-transportation system having highly reliable dust-particle control. When the substrates to be transported are reticles, the invention contributes to improved exposure-accuracy performance by controlling temperature during the transportation, thereby providing efficient transportation of the reticles.

Except as otherwise disclosed herein, the various components shown in outline or in block form in the figures are individually well known and their internal construction and operation are not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for transporting a substrate between a carrier, which holds the substrate, and a semiconductor manufacturing unit, which receives the substrate, the method comprising the steps of:

setting the carrier, which holds the substrate, on one of a plurality of loading ports;

applying the carrier to an exterior of a wall of a chamber, which houses the semiconductor manufacturing unit, in which chamber the environment of the semiconductor manufacturing unit is controlled;

removing a door of the carrier and a door of the chamber, as a unit, from the carrier and the chamber wall by one of a plurality of openers that includes a rotating unit attached to the interior of the chamber wall for rotating the carrier door and the chamber door as a unit into the chamber, each opener being provided at each loading port; and transferring the substrate from the carrier and to the carrier, when the door of the carrier and the door of the chamber have been rotatably removed as a unit by the opener in said removing step.

2. A method for transporting a substrate according to claim 1, further comprising the step of:

releasing a lock of the door of the carrier by lock releasing means provided in the door of the chamber.

3. A method for transporting a substrate according to claim 1, further comprising the step of:

supporting the door of the carrier and the door of the chamber as a unit by supporting means provided in the door of the chamber.

4. A method for transporting a substrate according to claim 1, wherein said removing step comprises horizontally removing the door of the carrier and the door of the chamber as a unit from the carrier and the chamber by the opener, and then rotating the unit around a rotation axis by the opener.

5. A method for transporting a substrate according to claim 1, wherein said removing step comprises rotating, by the rotation unit, the door of the carrier and the door of the chamber downwardly around a rotation axis of the rotation unit, as a unit.

6. A method for transporting a substrate according to claim 1, wherein the loading ports are provided overlapping each other in the vertical direction.

7. A method for transporting a substrate according to claim 1, further comprising providing a library in the vicinity of the semiconductor manufacturing unit, for storing a plurality of the substrates.

8. A method for transporting a substrate according to claim 1, wherein the carrier receives one of the substrates.

9. A method for transporting a substrate according to claim 8, wherein the substrate is a reticle.

10. A semiconductor manufacturing apparatus comprising:

a semiconductor manufacturing unit housed in a chamber, in which the environment of the semiconductor manufacturing unit is controlled;

a setting unit for setting a carrier, which holds a substrate, on one of a plurality of loading ports;

applying means for applying the carrier to an exterior of a wall of the chamber;

a plurality of openers each for removing a door of the carrier and a door of the chamber, as a unit, from the carrier and the chamber wall, each opener including a rotating unit attached to the interior of the chamber wall for rotating the carrier door and the chamber door as a unit into the chamber and each opener being provided at each loading port; and transporting means for transferring the substrate from the carrier and to the carrier when the door of the carrier and the door of the chamber have been rotatably removed as a unit by said opener, and for transporting the substrate between the carrier and the semiconductor manufacturing unit.

11. A semiconductor manufacturing apparatus according to claim 10, further comprising lock releasing means, provided on the chamber, for releasing a lock of the door of the carrier.

12. A semiconductor manufacturing apparatus according to claim 10, further comprising supporting means on the door of the chamber, for supporting the door of the carrier and the door of the chamber as a unit.

13. A semiconductor manufacturing apparatus according to claim 10, wherein said opener horizontally removes the door of the carrier and the door of the chamber, as a unit, from the carrier and the chamber, and then rotates the unit around a rotation axis.

14. A semiconductor manufacturing apparatus according to claim 10, wherein said rotation unit downwardly rotates the door of the carrier and the door of the chamber around a rotation axis of the rotation unit, as a unit.

15. A semiconductor manufacturing apparatus according to claim 10, wherein the loading ports are provided overlapping each other in a vertical direction.

16. A semiconductor manufacturing apparatus according to claim 10, further comprising:

a library for storing a plurality of the substrates in the vicinity of the semiconductor manufacturing unit.

17. A semiconductor manufacturing apparatus according to claim 10, wherein the carrier receives one of the substrates.

18. A semiconductor manufacturing apparatus according to claim 17, wherein the substrate is a reticle.

* * * * *

UNITED STATES PATENT AND TRADEMARK OFFICE
CERTIFICATE OF CORRECTION

PATENT NO.     : 6,517,304 B1
DATED          : February 11, 2003
INVENTOR(S)    : Ken Matsumoto It is certified that error appears in the above-identified patent and that said Letters Patent is hereby corrected as shown below:

<u>Column 7,</u>
Line 35, "chuck" should read -- chuck, --.

Signed and Sealed this

Sixteenth Day of September, 2003

JAMES E. ROGAN
*Director of the United States Patent and Trademark Office*